US008115276B2

United States Patent
Zhang et al.

(10) Patent No.: US 8,115,276 B2
(45) Date of Patent: Feb. 14, 2012

(54) INTEGRATED CIRCUIT SYSTEM EMPLOYING BACK END OF LINE VIA TECHNIQUES

(75) Inventors: Shaoqing Zhang, Singapore (SG); Fan Zhang, Singapore (SG); Shao-fu Sanford Chu, Singapore (SG); Bei Chao Zhang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 629 days.

(21) Appl. No.: 12/132,342

(22) Filed: Jun. 3, 2008

(65) Prior Publication Data

US 2009/0294904 A1  Dec. 3, 2009

(51) Int. Cl.
*H01L 21/283* (2006.01)
*H01L 21/02* (2006.01)
*H01L 29/92* (2006.01)

(52) U.S. Cl. ......... 257/532; 257/E29.343; 257/E21.008; 257/E21.159; 438/381; 438/597

(58) Field of Classification Search ................... 257/499, 257/532, 350, E29.343, E21.008, E21.159; 438/381, 597; 338/309
See application file for complete search history.

(56) References Cited

U.S. PATENT DOCUMENTS

| | | | |
|---|---|---|---|
| 2006/0087401 A1* | 4/2006 | Kerr et al. | 338/309 |
| 2007/0123015 A1* | 5/2007 | Chinthakindi et al. | 438/597 |
| 2007/0267733 A1 | 11/2007 | Cho et al. | |
| 2007/0279835 A1 | 12/2007 | Chinthakindi | |
| 2009/0141424 A1* | 6/2009 | Barth et al. | 361/311 |

* cited by examiner

*Primary Examiner* — Victor A Mandala
*Assistant Examiner* — Whitney T Moore
(74) *Attorney, Agent, or Firm* — Mikio Ishimaru

(57) ABSTRACT

An integrated circuit system that includes: providing a substrate including front-end-of-line circuitry; forming a first metallization layer over the substrate and electrically connected to the substrate; forming a viabar or a via group over the first metallization layer; and forming a second metallization layer over the first metallization layer and electrically connected to the first metallization layer through either the viabar or the via group.

20 Claims, 5 Drawing Sheets

INTEGRATED CIRCUIT SYSTEM EMPLOYING BACK END OF LINE VIA TECHNIQUES

TECHNICAL FIELD

The present invention relates generally to integrated circuits, and more particularly to an integrated circuit system employing back-end-of-line via techniques.

BACKGROUND ART

Integrated circuits find application in many of today's consumer electronics, such as cell phones, video cameras, portable music players, printers, computers, etc. Integrated circuits may include a combination of active devices, passive devices and their interconnections.

On-chip capacitors are critical components of integrated circuits. These capacitors are used for a variety of purposes including bypass and capacitive matching to analog and radio frequency integrated circuit applications. Recently, back-end-of-line (BEOL) vertical natural capacitors (VNCAP) with stacked via and inter-digitated metal structures have emerged as an attractive option for advanced CMOS and BiCMOS RF technologies because conventional planar capacitors such as metal-insulator-metal (MIM) capacitors require extra process steps and masks.

As today's integrated circuits become more complex, multi-level metallization technology (sometimes including more than 8 metallization layers) enables the formation of a VNCAP structure that can be achieved without the extra process steps and masks common to other on-chip capacitor structures. However, in order to achieve the higher capacitance density (capacitance/area) so desired for these BEOL VNCAP structures, the finger pitch of the VNCAP structure must be designed with more and more stringent minimum pitch requirements that sometimes violate VNCAP design rules.

Unfortunately, the progression of the minimum pitch requirement of these VNCAP structures is causing process difficulties and long-term reliability problems, such as via protrusions that cause time dependent dielectric breakdown (TDDB) failure, which are rapidly becoming some of the most critical challenges for qualification of such capacitors.

Thus, a need still remains for a reliable integrated circuit system and method of fabrication, wherein the integrated circuit system exhibits improved VNCAP reliability performance. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including front-end-of-line circuitry; forming a first metallization layer over the substrate and electrically connected to the substrate; forming a viabar or a via group over the first metallization layer; and forming a second metallization layer over the first metallization layer and electrically connected to the first metallization layer through either the viabar or the via group.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
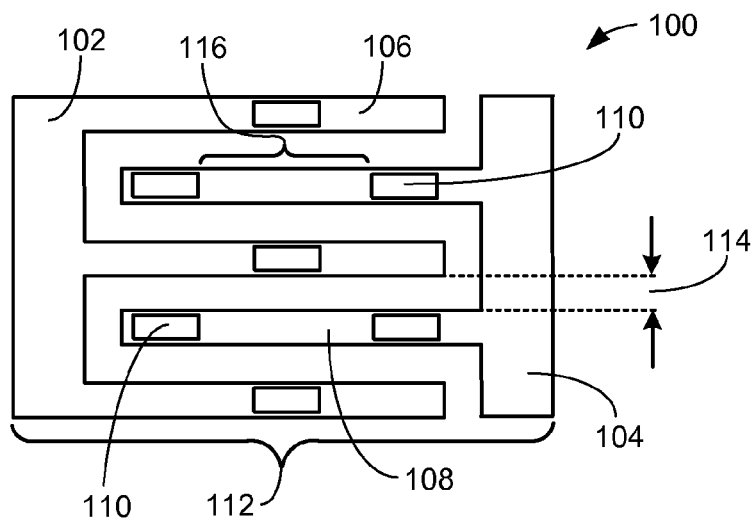
FIG. 1 is a partial plan view of an integrated circuit system in a back-end-of-line stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

The term "pitch" is used herein to mean the edge-to-edge distance between features in a pattern. For example, "pitch" could be defined as roughly equal to: (the width of a conductive trace) plus (the spacing between adjacent members of the conductive trace).

The term "viabar" is used herein to mean a via having a horizontal via length at least twice as long as a horizontal via width.

The term "via group" is used herein to mean at least two vias grouped within a horizontal via width of each other and having a combined horizontal via length at least twice as long as a horizontal via width.

The term "system" as used herein means and refers to the method and to the apparatus of the present invention in accordance with the context in which the term is used.

Generally, the following embodiments relate to the formation of an integrated circuit system including an interconnect, such as a viabar and/or a via group, which electrically connects vertically adjacent metallization layers formed in a back-end-of-line (BEOL) process. By forming a viabar or a via group by the processes described herein, the total area of the interconnect can be increased, the interconnect resistance can be lowered, and the effective capacitor plate area can be increased, thereby improving the reliability of the VNCAP structure. Accordingly the electrical field strength around the interconnects can be reduced, thereby improving the field profile between adjacent horizontal metal layers, which helps to improve the reliability performance of a vertical natural capacitor (VNCAP) formed within the integrated circuit system.

FIGS. 1-16, which follow, depict by way of example and not by limitation, an exemplary process flow for the formation of BEOL metallization layers within an integrated circuit system and they are not to be construed as limiting. It is to be understood that a plurality of conventional processes that are well known within the art and not repeated herein, may precede or follow FIGS. 1-16. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of active device structures and/or passive device structures. Exemplary illustrations of the integrated circuit system may include processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed. Additionally, it is to be understood that one or more of the integrated circuit system could be prepared at one time on a medium, which could be separated into individual or multiple integrated circuit assemblies at a later stage of fabrication.

Referring now to FIG. 1, therein is shown a partial plan view of an integrated circuit system 100 in a back-end-of-line stage of manufacture in accordance with an embodiment of the present invention. In some embodiments, the integrated circuit system 100 may include a VNCAP formed by BEOL metal layers, such as metallization layers M1-Mx where x may equal a positive integer greater than one (1), with staggered viabars. For purposes of discussion, this embodiment will be referred to as a staggered configuration due to the alignment of each of a viabar 110.

Generally, the integrated circuit system 100 includes a first terminal 102, a second terminal 104, a first conductive trace 106, a second conductive trace 108, and the viabar 110. The first terminal 102, the second terminal 104, the first conductive trace 106 and the second conductive trace 108 can be collectively referred to as a metallization layer 112.

Although, the present embodiment depicts a certain number of the first conductive trace 106, the second conductive trace 108 and the viabar 110, it is to be understood that the present embodiment described herein is not restricted to this specific embodiment and it will be readily apparent that more or less of the first conductive trace 106, the second conductive trace 108 and the viabar 110 may be practiced within the teachings herein, and one skilled in the art may readily form alternative embodiments with different numbers and combinations of the first conductive trace 106, the second conductive trace 108 and the viabar 110. Moreover, it is to be understood that one or more of the metallization layer 112 can be formed above or below the metallization layer 112, each separated by a dielectric material, for example.

More particularly, the integrated circuit system 100 may include the first terminal 102 and the second terminal 104, each of opposite polarity compared to the other, formed parallel and opposing the other. For example, the first terminal 102 may have a first polarity (e.g., negative) and the second terminal 104 may possess a second polarity (e.g., positive), or vice-versa. The first terminal 102 and the second terminal 104 can be made from a material that offers a low resistance to the passage of electrical current, such as a metal or a semiconducting material.

Projecting from the first terminal 102 and the second terminal 104 are the first conductive trace 106 and the second conductive trace 108, respectively, wherein alternating members are connected to the first terminal 102 and the second terminal 104, thereby forming an inter-digitated structure. Accordingly, the first conductive trace 106 and the second conductive trace 108 are separated and alternately connected to either of the first terminal 102 and the second terminal 104, thereby forming alternating members of the first conductive trace 106 and the second conductive trace 108 with first and second polarities. By way of example, the first conductive trace 106 and the second conductive trace 108 can be made from a material that offers a low resistance to the passage of electrical current, such as a metal or a semiconducting material. It will be appreciated by those skilled in the art that each of the first conductive trace 106 and the second conductive trace 108 can be separated by a dielectric material (not shown).

As technology scaling continues, the pitch between the first conductive trace 106 and the second conductive trace 108 becomes smaller, thereby helping to increase the capacitance density of BEOL VNCAP structures. For example, design requirements and current processing techniques permit a width range between approximately 50 nanometers and 400 nanometers for each of the first conductive trace 106 and the second conductive trace 108 and a spacing 114 between the first conductive trace 106 and the second conductive trace 108 ranging between approximately 50 nanometers and 400 nanometers.

As such, the pitch between the first conductive trace 106 and the second conductive trace 108 can range between approximately 100 nanometers and 800 nanometers. However, it is to be understood that the minimum width of each of the first conductive trace 106 and the second conductive trace 108, as well as the minimum dimension of the spacing 114, are only to be limited by the current processing technology node (e.g., 45 nm process, 32 nm process or below) for forming an inter-digitated structure, such as the metallization layer 112.

It will be appreciated by those skilled in the art that each of the metallization layer 112 can be based off of a unit cell. For example, metal layers M1-M5 could represent the unit cell and metal layers M6-M7 and M8-M9 could be two times and three times the unit cell dimension, respectively.

Typically, vertically adjacent ones of the metallization layer 112 can be electrically interconnected through the viabar 110. In some embodiments, each of the viabar 110 formed over the first conductive trace 106 and the second conductive trace 108 can be staggered such that no two adjacent ones of the viabar 110 overlap when viewed as a cross section. By forming each of the viabar 110 over the first conductive trace 106 so as to not overlap the length of an adjacent one of the viabar 110 formed over the second conductive trace 108, the risk of short circuits caused by misalignment of the viabar 110 can be greatly reduced. As such, in some embodiments, a distance 116 between each of the viabar 110 located above the first conductive trace 106 and/or the second conductive trace 108 can be substantially equivalent to or in excess of the horizontal via length of the viabar 110.

It will be appreciated by those skilled in the art that the viabar 110 can be made from a material that offers a low resistance to the passage of electrical current, such as a metal or a semiconducting material.

Generally, the viabar 110 can be constructed as a solid and continuous interconnect/via that possesses a horizontal via length at least twice as long as a horizontal via width. By forming the viabar 110 to possess a horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure. Furthermore, it will be appreciated by those skilled in the art that the viabar 110 permits application of a selective data preparation program that effectively improves the top-profile of the viabar 110 while increasing the total area of the viabar 110, thereby helping to prevent via open issues during etching.

Referring now to FIGS. 2-5. FIGS. 2-5 include some of the same reference numbers used to describe the integrated circuit system 100 in FIG. 1. It is noted that the layers, structures, and process steps corresponding to such reference numbers generally include the same characteristics (e.g., composition, thickness, function, process techniques, etc.) as those described in reference to FIG. 1 and, therefore, their descriptions are not reiterated in detail for FIGS. 2-5. Rather the descriptions of the layers, structures, and process steps corresponding to reference numbers in FIG. 1 are incorporated for the same reference numbers included in FIGS. 2-5.

Figure 2:
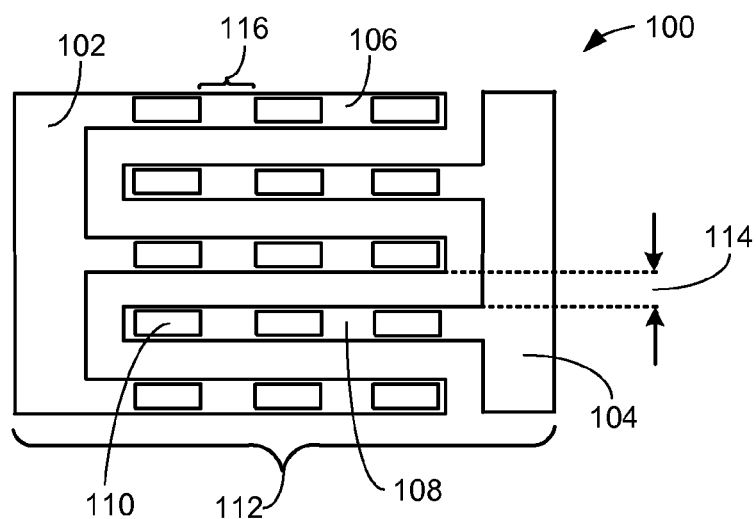
FIG. 2 is a partial plan view of an integrated circuit system in a back-end-of-line stage of manufacture in accordance with another embodiment of the present invention.

Referring now to FIG. 2, therein is shown a partial plan view of the integrated circuit system 100 in a back-end-of-line stage of manufacture in accordance with another embodiment of the present invention. In some embodiments, the integrated circuit system 100 may include a VNCAP formed by BEOL metal layers, such as metallization layers M1-Mx where x may equal a positive integer greater than one (1), with adjacent viabars. For purposes of discussion, this embodiment will be referred to as an adjacent configuration due to the alignment of each of the viabar 110.

The integrated circuit system 100 may include the first terminal 102, the second terminal 104, the first conductive trace 106, the second conductive trace 108, the viabar 110, the metallization layer 112, and the spacing 114. It is to be understood that the first terminal 102, the second terminal 104, the first conductive trace 106, the second conductive trace 108, the viabar 110, the metallization layer 112, and the spacing 114 may include any of the characteristics, such as material composition, thickness, and process techniques, described above in regard to FIG. 1.

The integrated circuit system 100, however, differs from the integrated circuit system 100, of FIG. 1, by forming each of the viabar 110 so as to substantially overlap the length of an adjacent one of the viabar 110 when viewed as a cross section (i.e., an adjacent configuration). As such, it will be appreciated by those skilled in the art that by forming each of the viabar 110 over the first conductive trace 106 so as to overlap the length of an adjacent one of the viabar 110 formed over the second conductive trace 108 that the capacitance of the BEOL VNCAP can be maximized.

Moreover, it will be appreciated by those skilled in the art that the distance 116 between each of the viabar 110 located above the first conductive trace 106 and/or the second conductive trace 108 can be in excess of or less than the horizontal via length of the viabar 110.

Figure 3:
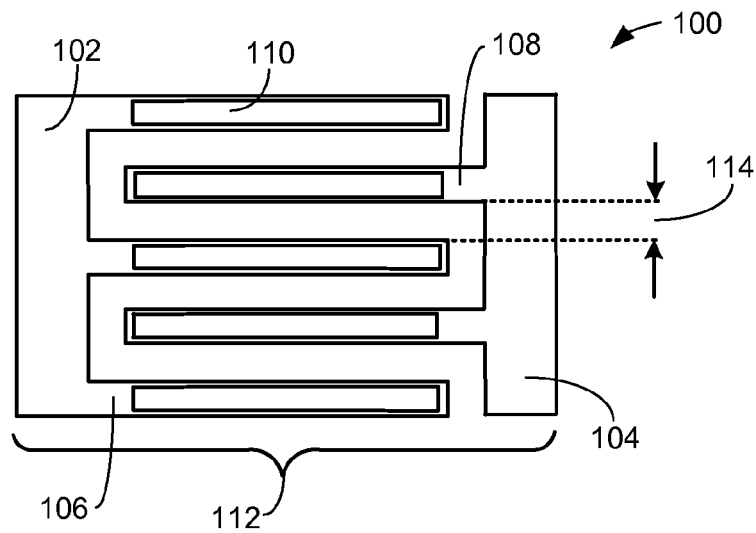
FIG. 3 is a partial plan view of an integrated circuit system in a back-end-of-line stage of manufacture in accordance with another embodiment of the present invention.

Referring now to FIG. 3, therein is shown a partial plan view of the integrated circuit system 100 in a back-end-of-line stage of manufacture in accordance with another embodiment of the present invention. In some embodiments, the integrated circuit system 100 may include a VNCAP formed by BEOL metal layers, such as metallization layers M1-Mx where x may equal a positive integer greater than one (1), with continuous viabars. For purposes of discussion, this embodiment will be referred to as a continuous configuration due to the alignment of each of the viabar 110.

The integrated circuit system 100 may include the first terminal 102, the second terminal 104, the first conductive trace 106, the second conductive trace 108, the viabar 110, the metallization layer 112, and the spacing 114. It is to be understood that the first terminal 102, the second terminal 104, the first conductive trace 106, the second conductive trace 108, the viabar 110, the metallization layer 112, and the spacing 114 may include any of the characteristics, such as material composition, thickness, and process techniques, described above in regard to FIG. 1.

The integrated circuit system 100, however, differs from the integrated circuit system 100, of FIG. 1, by forming each of the viabar 110 as a solid and continuous form of the viabar 110 that can cover about 20% to about 95% of the length or area of each of the first conductive trace 106 and/or the second conductive trace 108. As such, each of the viabar 110 formed over the first conductive trace 106 can overlap about 5% to about 95% of the length of an adjacent one of the viabar 110 formed over the second conductive trace 108 when viewed as a cross section (i.e., a continuous configuration).

It will be appreciated by those skilled in the art that by forming each of the viabar 110 as a continuous interconnect covering about 20% to about 95% of the length or area of each of the first conductive trace 106 and the second conductive trace 108 that the capacitance of the BEOL VNCAP can be maximized.

Figure 4:
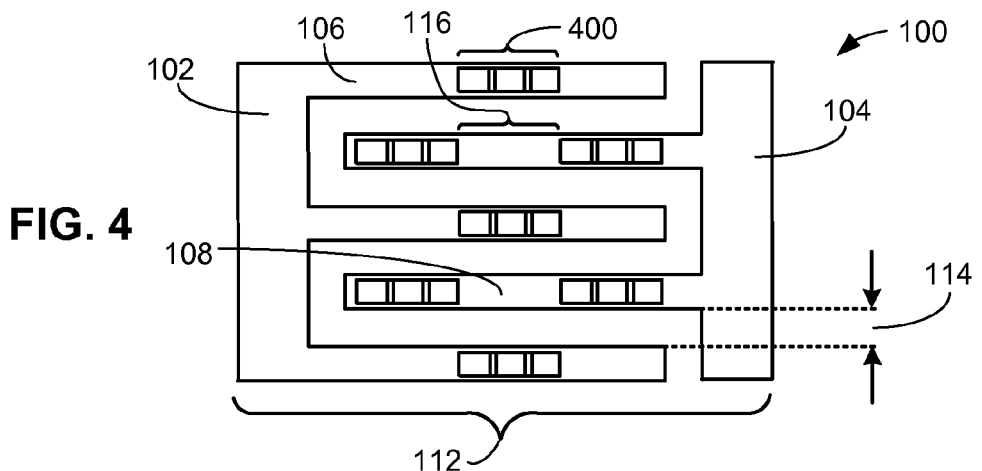
FIG. 4 is a partial plan view of an integrated circuit system in a back-end-of-line stage of manufacture in accordance with another embodiment of the present invention.

Referring now to FIG. 4, therein is shown a partial plan view of the integrated circuit system 100 in a back-end-of-line stage of manufacture in accordance with another embodiment of the present invention. In some embodiments, the integrated circuit system 100 may include a VNCAP formed by BEOL metal layers, such as metallization layers M1-Mx where x may equal a positive integer greater than one (1), with staggered via groups. For purposes of discussion, this embodiment will be referred to as a staggered configuration due to the alignment of each of a via group 400.

The integrated circuit system 100 may include the first terminal 102, the second terminal 104, the first conductive trace 106, the second conductive trace 108, the metallization layer 112, the spacing 114, and the via group 400. It is to be understood that the first terminal 102, the second terminal 104, the first conductive trace 106, the second conductive trace 108, the metallization layer 112, and the spacing 114 may include any of the characteristics, such as material composition, thickness, and process techniques, described above in regard to FIG. 1.

The integrated circuit system 100, however, differs from the integrated circuit system 100, of FIG. 1, by forming each of the viabar 110, of FIG. 1, as the via group 400. Unlike the continuous interconnect structure of the viabar 110, the via group 400 may include at least two vias grouped within a horizontal via width of each other and having a combined horizontal via length at least twice as long as a horizontal via width. It is to be understood that each of the via within the via group 400 may act independently or collectively. By forming the via group 400 to possess a combined horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure.

Moreover, it will be appreciated by those skilled in the art that by forming each of the via group 400 over the first conductive trace 106 so as to not overlap the length of an adjacent one of the via group 400 formed over the second conductive trace 108 when viewed as a cross section (i.e., a staggered configuration), the risk of short circuits caused by misalignment of the via group 400 can be greatly reduced. As such, in some embodiments, the distance 116 between each of the via group 400 located above the first conductive trace 106 and/or the second conductive trace 108 can be substantially equivalent to or in excess of the combined horizontal via length of the via group 400.

Figure 5:
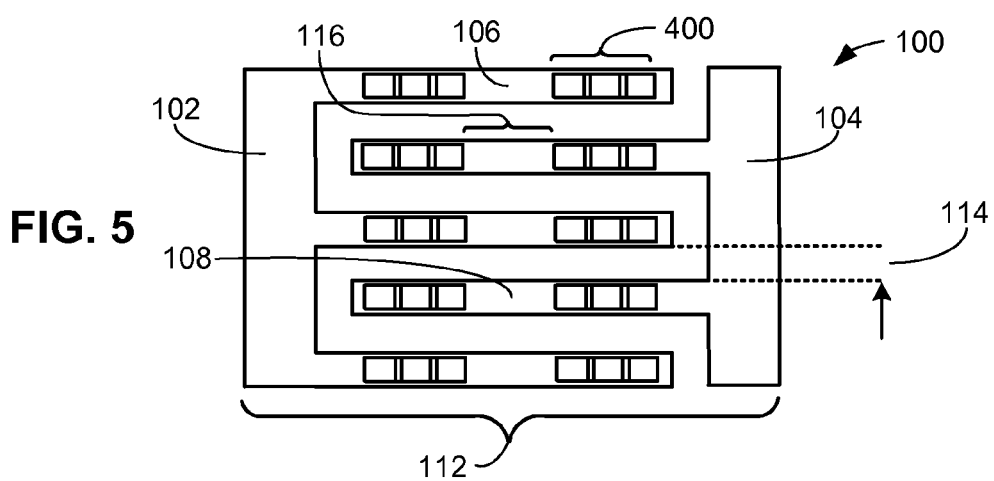
FIG. 5 is a partial plan view of an integrated circuit system in a back-end-of-line stage of manufacture in accordance with another embodiment of the present invention.

Referring now to FIG. 5, therein is shown a partial plan view of the integrated circuit system 100 in a back-end-of-line stage of manufacture in accordance with another embodiment of the present invention. In some embodiments, the integrated circuit system 100 may include a VNCAP formed by BEOL metal layers, such as metallization layers M1-Mx where x may equal a positive integer greater than one (1), with adjacent via groups. For purposes of discussion, this embodiment will be referred to as an adjacent configuration due to the alignment of each of the via group 400.

The integrated circuit system 100 may include the first terminal 102, the second terminal 104, the first conductive trace 106, the second conductive trace 108, the metallization layer 112, the spacing 114, and the via group 400. It is to be understood that the first terminal 102, the second terminal 104, the first conductive trace 106, the second conductive trace 108, the metallization layer 112, and the spacing 114 may include any of the characteristics, such as material composition, thickness, and process techniques, described above in regard to FIG. 1.

The integrated circuit system 100, however, differs from the integrated circuit system 100, of FIG. 1, by forming each of the viabar 110, of FIG. 1, as the via group 400 that are adjacent to one another. Unlike the continuous interconnect structure of the viabar 110, the via group 400 may include at least two vias grouped within a horizontal via width of each other and having a combined horizontal via length at least twice as long as a horizontal via width. It is to be understood that each of the via within the via group 400 may act independently or collectively. By forming the via group 400 to possess a combined horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure.

Moreover, it will be appreciated by those skilled in the art that by forming each of the via group 400 over the first conductive trace 106 so as to overlap the length of an adjacent one of the via group 400 formed over the second conductive trace 108 (i.e., an adjacent configuration), when viewed as a cross section, that the capacitance of the BEOL VNCAP can be maximized.

Additionally, it will be appreciated by those skilled in the art that the distance 116 between each of the via group 400 located above the first conductive trace 106 and/or the second conductive trace 108 can be in excess of or less than the combined horizontal via length of the via group 400.

Figures 6, 7:
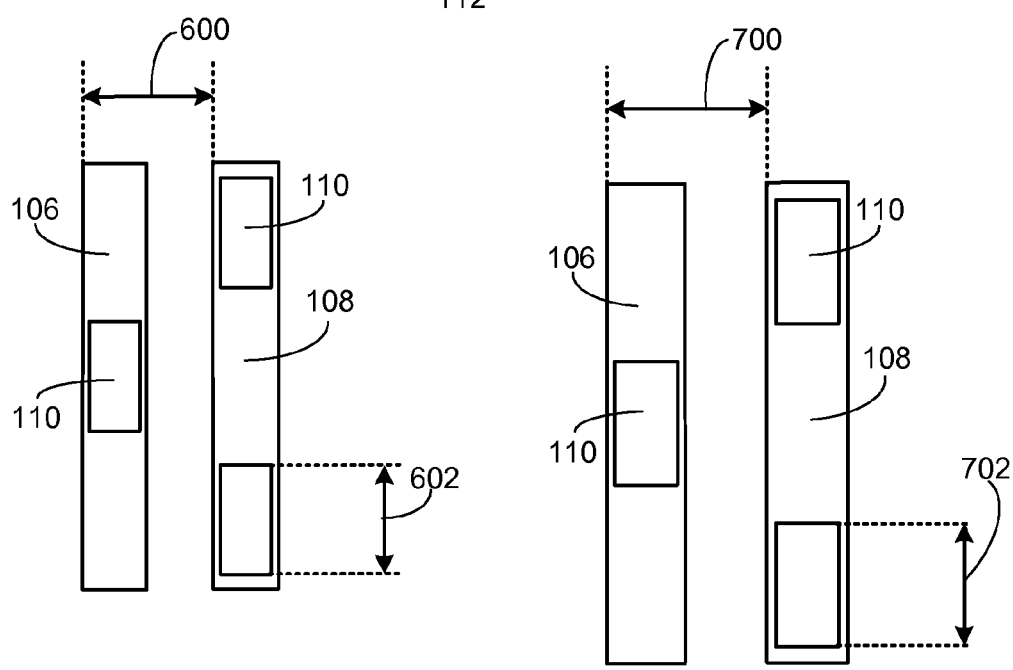
FIG. 6 is a partial plan view of a first conductive trace and a second conductive trace for a thin wire metallization level employing a staggered configuration of a viabar in accordance with an embodiment of the present invention.
FIG. 7 is a partial plan view of a first conductive trace and a second conductive trace for a thick wire metallization level employing a staggered configuration of a viabar in accordance with an embodiment of the present invention.

Referring now to FIG. 6, therein is shown a partial plan view of the first conductive trace 106 and the second conductive trace 108 for a thin wire metallization level employing a staggered configuration of the viabar 110 in accordance with an embodiment of the present invention. In some embodiments, the pitch (demarcated by a dimension 600) between the first conductive trace 106 and the second conductive trace 108 can be 200 nanometers or less. Typically, a metal level with a pitch of 200 nanometers or less can be described as a thin wire metallization level.

Generally, the viabar 110 may include a solid and continuous interconnect/via that possesses a horizontal via length at least twice as long as a horizontal via width. By way example, a length dimension 602 can roughly illustrate the horizontal via length of the viabar 110 of the present embodiments. By forming the length dimension 602 of the viabar 110 to possess a horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure. Furthermore, it will be appreciated by those skilled in the art that the viabar 110 permits application of a selective data preparation program that effectively improves the top-profile of the viabar 110 while increasing the total area of the viabar 110, thereby helping to prevent via open issues during etching.

Additionally, although the present embodiment depicts a certain number of the first conductive trace 106, the second conductive trace 108, and the viabar 110, it is to be understood that the present embodiment described herein is not restricted to this specific embodiment and it will be readily apparent that more or less of the first conductive trace 106, the second conductive trace 108, and the viabar 110 may be practiced within the teachings herein, and one skilled in the art may readily form alternative embodiments with different numbers and combinations of the first conductive trace 106, the second conductive trace 108, and the viabar 110. Moreover, it will be appreciated by those skilled in the art that the viabar 110 may also be formed adjacent to one another as in FIG. 2 or as a continuous configuration of the viabar 110 as in FIG. 3. Furthermore, it is to be understood that one or more of the metallization layer 112, of FIG. 1, can be formed above or below the first conductive trace 106 and the second conductive trace 108, each separated by a dielectric material, for example.

Referring now to FIG. 7, therein is shown a partial plan view of the first conductive trace 106 and the second conductive trace 108 for a thick wire metallization level employing a staggered configuration of the viabar 110 in accordance with an embodiment of the present invention. In some embodiments, the pitch (demarcated by a dimension 700) between the first conductive trace 106 and the second conductive trace 108 can be 200 nanometers or more. Typically, a metal level with a pitch of 200 nanometers or more can be described as a thick wire metallization level.

Generally, the viabar 110 may include a solid and continuous interconnect/via that possesses a horizontal via length at least twice as long as a horizontal via width. By way example, a length dimension 702 can roughly illustrate the horizontal via length of the viabar 110 of the present embodiments. By forming the length dimension 702 of the viabar 110 to possess a horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure. Furthermore, it will be appreciated by those skilled in the art that the viabar 110 permits application of a selective data preparation program that effectively improves the top-profile of the viabar 110 while increasing the total area of the viabar 110, thereby helping to prevent via open issues during etching.

Additionally, although the present embodiment depicts a certain number of the first conductive trace 106, the second conductive trace 108, and the viabar 110, it is to be understood that the present embodiment described herein is not restricted to this specific embodiment and it will be readily apparent that more or less of the first conductive trace 106, the second conductive trace 108, and the viabar 110 may be practiced within the teachings herein, and one skilled in the art may readily form alternative embodiments with different numbers and combinations of the first conductive trace 106, the second conductive trace 108, and the viabar 110. Moreover, it will be appreciated by those skilled in the art that the viabar 110 may also be formed adjacent to one another as in FIG. 2 or a as a continuous configuration of the viabar 110 as in FIG. 3. Furthermore, it is to be understood that one or more of the metallization layer 112, of FIG. 1, can be formed above or below the first conductive trace 106 and the second conductive trace 108, each separated by a dielectric material, for example.

Figure 8:
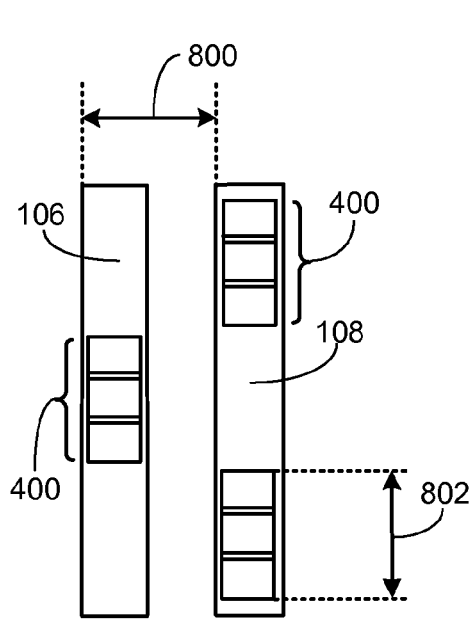
FIG. 8 is a partial plan view of a first conductive trace and a second conductive trace for a thin wire metallization level employing a staggered configuration of a via group in accordance with an embodiment of the present invention.

Referring now to FIG. 8, therein is shown a partial plan view of the first conductive trace 106 and the second conductive trace 108 for a thin wire metallization level employing a staggered configuration of the via group 400 in accordance with an embodiment of the present invention. In some embodiments, the pitch (demarcated by a dimension 800) between the first conductive trace 106 and the second conductive trace 108 can be 200 nanometers or less. Typically, a metal level with a pitch of 200 nanometers or less can be described as a thin wire metallization level.

Generally, the via group 400 may include at least two vias grouped within a horizontal via width of each other and having a combined horizontal via length at least twice as long as a horizontal via width. By way example, a length dimension 802 can roughly illustrate the combined horizontal via length of the via group 400 of the present embodiments. By forming the length dimension 802 of the via group 400 to possess a combined horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure.

Additionally, although the present embodiment depicts a certain number of the first conductive trace 106, the second conductive trace 108, and the via group 400, it is to be understood that the present embodiment described herein is not restricted to this specific embodiment and it will be readily apparent that more or less of the first conductive trace 106, the second conductive trace 108, and the via group 400 may be practiced within the teachings herein, and one skilled in the art may readily form alternative embodiments with different numbers and combinations of the first conductive trace 106, the second conductive trace 108, and the via group 400. Moreover, it will be appreciated by those skilled in the art that the via group 400 may also be formed adjacent to one another as in FIG. 5. Furthermore, it is to be understood that one or more of the metallization layer 112, of FIG. 1, can be formed above or below the first conductive trace 106 and the second conductive trace 108, each separated by a dielectric material, for example.

Figure 9:
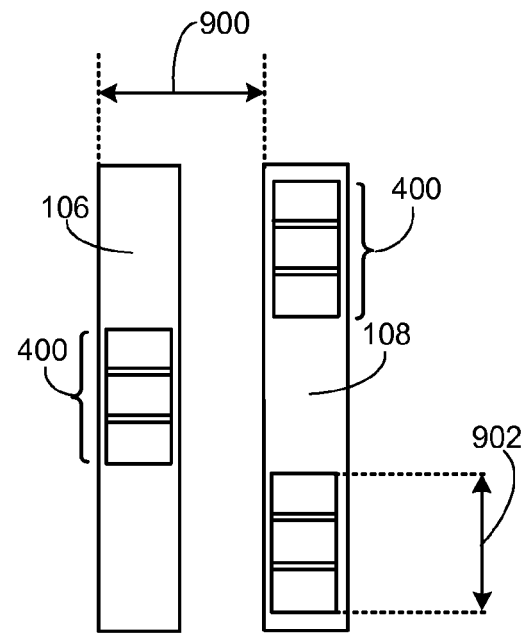
FIG. 9 is a partial plan view of a first conductive trace and a second conductive trace for a thick wire metallization level employing a staggered configuration of a via group in accordance with an embodiment of the present invention.

Referring now to FIG. 9, therein is shown a partial plan view of the first conductive trace 106 and the second conductive trace 108 for a thick wire metallization level employing a staggered configuration of the via group 400 in accordance with an embodiment of the present invention. In some embodiments, the pitch (demarcated by a dimension 900) between the first conductive trace 106 and the second conductive trace 108 can be 200 nanometers or more. Typically, a metal level with a pitch of 200 nanometers or more can be described as a thick wire metallization level.

Generally, the via group 400 may include at least two vias grouped within a horizontal via width of each other and having a combined horizontal via length at least twice as long as a horizontal via width. By way example, a length dimension 902 can roughly illustrate the combined horizontal via length of the via group 400 of the present embodiments. By forming the length dimension 902 of the via group 400 to possess a combined horizontal via length at least twice as long as a horizontal via width, the total area of the interconnect/via can be increased, the interconnect/via resistance can be lowered, and the effective capacitor plate area of a VNCAP structure can be increased, thereby improving the reliability of the VNCAP structure.

Additionally, although the present embodiment depicts a certain number of the first conductive trace 106, the second conductive trace 108, and the via group 400, it is to be understood that the present embodiment described herein is not restricted to this specific embodiment and it will be readily apparent that more or less of the first conductive trace 106, the second conductive trace 108, and the via group 400 may be practiced within the teachings herein, and one skilled in the art may readily form alternative embodiments with different numbers and combinations of the first conductive trace 106, the second conductive trace 108, and the via group 400. Moreover, it will be appreciated by those skilled in the art that the via group 400 may also be formed adjacent to one another as in FIG. 5. Furthermore, it is to be understood that one or more of the metallization layer 112, of FIG. 1, can be formed above or below the first conductive trace 106 and the second conductive trace 108, each separated by a dielectric material, for example.

Figure 10:
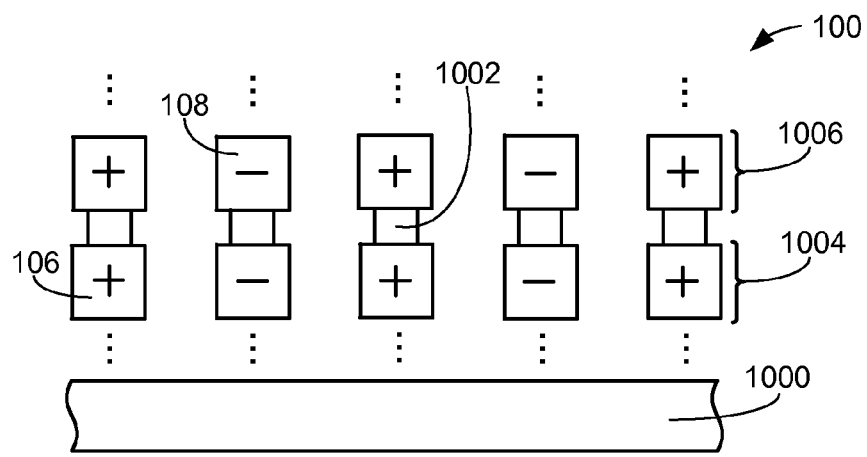
FIG. 10 is a partial cross section view of an integrated circuit system in accordance with an embodiment of the present invention.

Referring now to FIG. 10, therein is shown a partial cross section view of the integrated circuit system 100 in accordance with an embodiment of the present invention. The integrated circuit system 100 includes a substrate 1000, the first conductive trace 106 and the second conductive trace 108, and an interconnect 1002, such as the viabar 110, of FIGS. 1-3, or the via group 400, of FIGS. 4-5.

Generally, the substrate 1000 represents the portion of the integrated circuit system 100 formed by front-end-of-line (FEOL) processing steps (e.g., deposition, oxidation, implantation, etc.). As is well known in the art, FEOL processing typically forms active and/or passive circuitry/components on, over, and/or within the substrate 1000. As such, it will be appreciated by those skilled in the art that the substrate 1000 of the present disclosure may include any number of active device structures, passive device structures, or combinations thereof. Accordingly, the integrated circuit system 100 may include electrical circuits such as, but not limited to, processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed. Additionally, it is to be understood that one or more of the integrated circuit system 100 could be prepared at one time on the substrate 1000, which could be separated into individual or multiple integrated circuit assemblies at a later stage of fabrication.

Generally, the layers formed above the substrate 1000, such as the first conductive trace 106, the second conductive trace 108, and the interconnect 1002, are formed by BEOL processing steps (e.g., by deposition of metals and dielectrics to create horizontally planar metal layers interconnected by vias). It is to be understood that each of the first conductive trace 106 and the second conductive trace 108 can be, respectively, connected to the first terminal 102 and the second terminal 104, both of FIG. 1.

In some embodiments, some of the first conductive trace 106 and the second conductive trace 108 can be grouped as a first metallization layer 1004 and others of the first conductive trace 106 and the second conductive trace 108 can be grouped as a second metallization layer 1006. By way of example, the first metallization layer 1004 can be in electrical contact with the substrate 1000 or it can be in electrical contact with another metal layer. As such, although the present embodiment only depicts the first metallization layer 1004 and the second metallization layer 1006, it is to be understood the more or less of the metal layers could be formed above and/or below the first metallization layer 1004 and the second metallization layer 1006.

Generally, each of the first conductive trace 106 and the second conductive trace 108 formed on a horizontally planar layer (e.g., the first metallization layer 1004) can be described as a metal layer, which can be vertically interconnected by the interconnect 1002 to adjacent (e.g., above and below) horizontally planar layers of the first conductive trace 106 and the second conductive trace 108 (e.g., the second metallization layer 1006). Additionally, each of the first conductive trace 106 and the second conductive trace 108 may alternately possess a first or second polarity, shown as either positive or negative, thereby forming the inter-digitated structure common to a BEOL VNCAP structure. It is to be understood that the order of polarity depicted by the "plus" and "minus" signs within the first conductive trace 106 and the second conductive trace 108 is not important, what is important is that the polarity alternates between horizontally adjacent members of the first conductive trace 106 and the second conductive trace 108 within each of the first metallization layer 1004 and the second metallization layer 1006.

Figure 11:
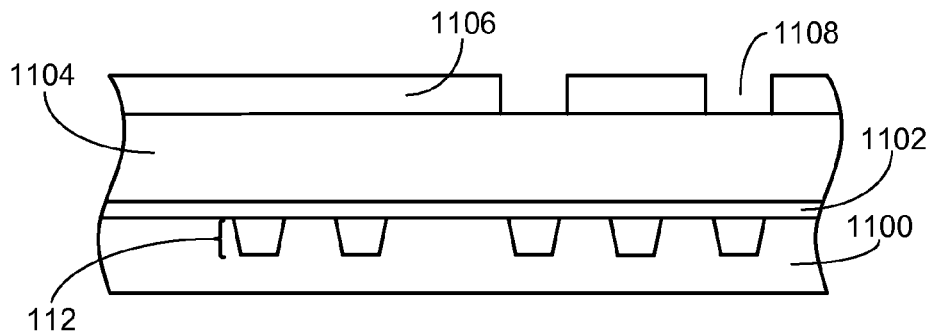
FIG. 11 is a partial cross sectional view of back-end-of-line metallization layers formed within an integrated circuit system in accordance with an embodiment of the present invention.

Referring now to FIG. 11, therein is shown a partial cross sectional view of back-end-of-line metallization layers formed within the integrated circuit system 100 in accordance with an embodiment of the present invention. The integrated circuit system 100 includes a first dielectric layer 1100, the metallization layer 112, such as such as metallization layers M1-Mx where x may equal a positive integer greater than one (1), a capping layer 1102, a second dielectric layer 1104, and a first photoresist material 1106.

Generally, the first dielectric layer 1100 may include an insulating material with a dielectric constant (k) value ranging from low to high depending upon the desired capacitance density of the VNCAP structure formed by the BEOL metallization layers. For example, the first dielectric layer 1100 may include materials such as silicon oxyfluoride, porous dielectrics, polyarylene ether, silicon dioxide, or combinations thereof. The thickness of the first dielectric layer 1100 can range from about 500 nanometers to about 5000 nanometers depending upon the design requirements of the integrated circuit system 100. In general, the first dielectric layer 1100 can be formed by a variety of techniques, including, but not limited to, chemical vapor deposition, physical vapor deposition, and/or spin coating.

The metallization layer 112 can be formed within the first dielectric material 1000. By way of example, the metallization layer 112 may include a material that offers a low resistance to the passage of electrical current, such as a metal, a semiconducting material, or combinations thereof. The surface of the metallization layer 112 adjacent the capping layer 1102 can range in width from about 50 nanometers or less (e.g., depending on the process technology node) to about 400 nanometers depending upon the design requirements of the integrated circuit system 100 (e.g., the VNCAP capacitance density). In general, the metallization layer 112 can be formed by a variety of conventional processing techniques, including, but not limited to, damascene trench fill or subtractive etching. It will be appreciated by those skilled in the art that the metallization layer 112 may also include dummy fill structures to reduce loading effects during etching.

The capping layer 1102 can be formed over or on the first dielectric layer 1100 and the metallization layer 112. The capping layer 1102 may include any material that acts as an etch stop layer during etching. For example, the capping layer 1102 may include materials such as silicon nitride, silicon carbo-nitride, silicon oxy-carbo-nitride, silicon carbide, or combinations thereof. The thickness of the capping layer 1102 can range from about 50 nanometers to about 500 nanometers depending upon the design requirements of the integrated circuit system 100. In general, the capping layer 1102 can be formed by a variety of techniques, including, but not limited to, chemical vapor deposition (e.g., high density plasma or plasma enhanced), physical vapor deposition, and/or spin coating.

The second dielectric layer 1104 can be formed over or on the capping layer 1102. The second dielectric layer 1104 may include an insulating material with a dielectric constant value (k) ranging from low to high depending upon the desired capacitance density of the VNCAP structure formed by the BEOL metallization layers. For example, the second dielectric layer 1104 may include materials such as silicon oxyfluoride, porous dielectrics, polyarylene ether, silicon dioxide, or combinations thereof. The thickness of the second dielectric layer 1104 can range from about 500 nanometers to about 5000 nanometers depending upon the design requirements of the integrated circuit system 100. In general, the second dielectric layer 1104 can be formed by a variety of techniques, including, but not limited to, chemical vapor deposition, physical vapor deposition, and/or spin coating.

The first photoresist material 1106 can be formed over or on the second dielectric layer 1104. The first photoresist material 1106 may include any material that acts as an energy sensitive film such as a negative tone resist, a positive tone resist, or a chemically amplified resist that is deposited by techniques well known in the art and not repeated herein. It is to be understood that the first photoresist material 1106 may include one or more patterned photoresist layers including additional layers, such as a primer, a top anti-reflective coating and/or a bottom anti-reflective coating that may be employed to enhance the development of the first photoresist material 1106.

As is well known in the art, the first photoresist material 1106 can be exposed to actinic radiation through a reticle or mask with transparent and opaque regions to form a hole 1108. The light passing through the transparent regions of the reticle or mask exposes the underlying photoresist layer and depending upon the photoresist layer composition, the exposed portions of the photoresist can either become soluble or insoluble to a subsequent developer, thereby forming each of the hole 1108.

Figure 12:
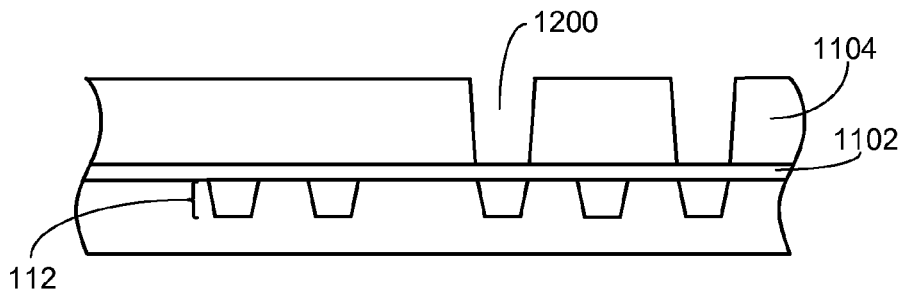
FIG. 12 is the structure of FIG. 11 after etching.

Referring now to FIG. 12, therein is shown the structure of FIG. 11 after etching. By way of example, the second dielectric layer 1104 can be etched by a multitude of processes including, but not limited to, wet etching and/or dry etching (e.g., a reactive ion etch process). In some embodiments, the etching processes may employ isotropic etchants that exhibit a high etch selectivity with regards to the material chosen for the capping layer 1102. Generally, the etch process forms one or more of an opening 1200 that terminates upon reaching the capping layer 1102 formed over one or more of the metallization layer 112. The opening 1200 may act as a structure for the subsequent formation of the viabar 110, of FIGS. 1-3, or the via group 400, of FIGS. 4-5. Subsequent to etching the opening 1200, the first photoresist material 1106, of FIG. 11, can be removed by techniques well known in the art and not repeated herein.

Figure 13:
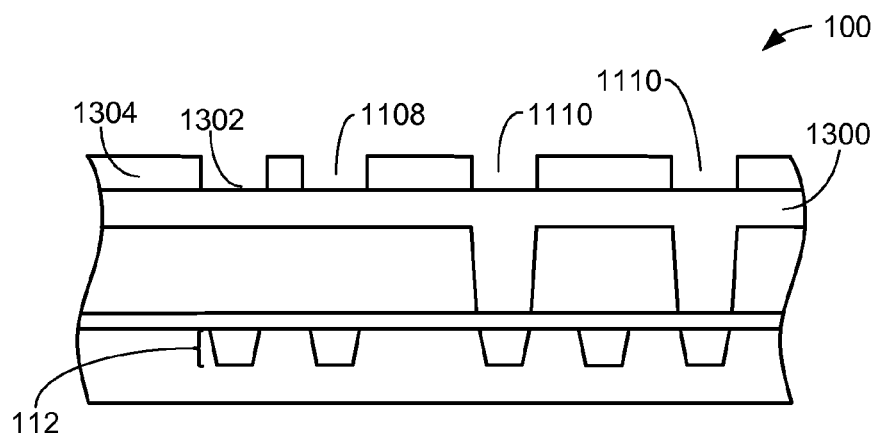
FIG. 13 is the structure of FIG. 12 after further processing.

Referring now to FIG. 13, therein is shown the structure of FIG. 12 after further processing. A material layer 1300 is deposited over the integrated circuit system 100. Generally, the material layer 1300 may include any material that that can substantially planarize a top surface 1302 of the integrated circuit system 100, thereby enhancing the printability of a subsequently deposited resist layer. In some embodiments, the material layer 1300 may include an organic material such as a non-fluorine coating, for example.

A second photoresist material 1304 can be deposited over or on the material layer 1300. The type, formation, and patterning of the photoresist material are described above in FIG. 10. Generally, each of the hole 1108 formed within the second photoresist material 1304 can be strategically aligned over one or more of the metallization layer 112. In some embodiments, one or more of an interconnect hole 1110 may possess dimensions substantially equivalent to the dimensions of the viabar 110, of FIGS. 1-3, or the via group 400, of FIGS. 4-5.

Figure 14:
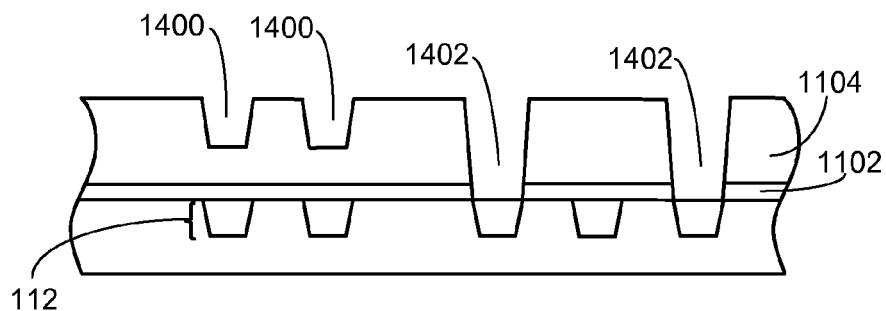
FIG. 14 is the structure of FIG. 13 after etching.

Referring now to FIG. 14, therein is shown the structure of FIG. 13 after etching. By way of example, the material layer 1300, of FIG. 13, the second dielectric layer 1104 and the capping layer 1102 can be etched by a multitude of processes including, but not limited to, wet etching and/or dry etching (e.g., a reactive ion etch process). In some embodiments, the etching process may employ isotropic etchants with different etch rates for each of the material layer 1300, the second dielectric layer 1104 and the capping layer 1102.

Generally, the etch process forms one or more of a metallization opening 1400 and one or more of an interconnect opening 1402. The metallization opening 1400 may act as another of the metallization layer 112 or as dummy fill patterns that reduce wire width and variability induced by etching processes, while the interconnect opening 1402 may act as the space created for the subsequent deposition of the viabar 110, of FIGS. 1-3, or the via group 400, of FIGS. 4-5. In some embodiments, the etch process removes selective portions of the capping layer 1102 to expose one or more of the metallization layer 112, thereby permitting electrical connection between the metallization layer 112 and a subsequently deposited interconnect, such as the viabar 110, of FIGS. 1-3, or the via group 400, of FIGS. 4-5.

Subsequent to etching the metallization opening 1400 and the interconnect opening 1402, the material layer 1300 and the second photoresist material 1304, of FIG. 13, can be removed by techniques well known in the art such as wet and/or dry photoresist clean processes.

Figure 15:
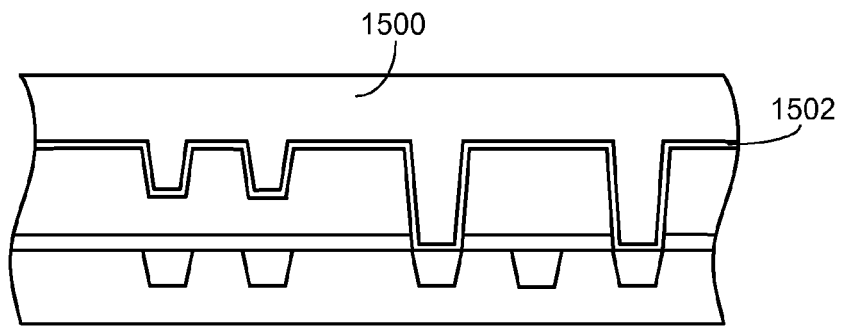
FIG. 15 is the structure of FIG. 14 after forming a conductive layer.

Referring now to FIG. 15, therein is shown the structure of FIG. 14 after forming a conductive layer 1500. Prior to forming the conductive layer 1500, a barrier layer 1502 can be optionally formed to promote adhesion and/or prevent electromigration or intermixing of materials above and below the barrier layer 1502. In some embodiments, the barrier layer 1502 may include refractory metals, such as, but not limited to, tantalum (Ta), tungsten (W), titanium (Ti), or combinations thereof.

The conductive layer 1500 can be made from a material that offers a low resistance to the passage of electrical current, such as a metal or a semiconducting material. In some embodiments, the conductive layer 1500 may include copper. Generally, the conductive layer 1500 is overfilled to ensure complete fill of each of the metallization opening 1400 and the interconnect opening 1402, both of FIG. 14.

Figure 16:
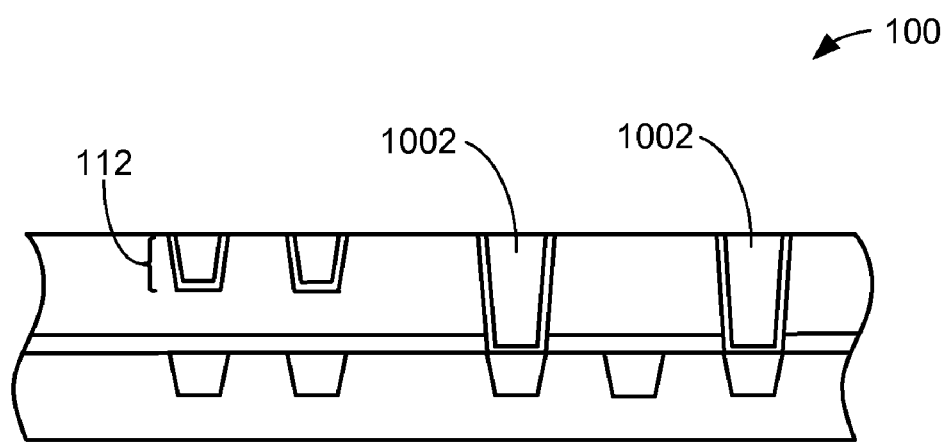
FIG. 16 is the structure of FIG. 15 after etching.

Referring now to FIG. 16, therein is shown the structure of FIG. 15 after etching. Generally, the conductive layer 1500, of FIG. 15, and the integrated circuit system 100 are locally or globally planarized by a chemical mechanical planarization (CMP) process; however, it is to be understood that a multitude of alternate etch-back processes could be employed including, but not limited to, wet etching and/or dry etching techniques. After etching the integrated circuit system 100, it is to be understood that the conductive layer 1500 can form the interconnect 1002, such as the viabar 110, of FIGS. 1-3, or the via group 400, of FIGS. 4-5. Additionally, after etching the integrated circuit system 100, it is to be understood that the conductive layer 1500 can also form the metallization layer 112 or a dummy fill pattern.

Subsequent to etching, it will be appreciated by those skilled in the art that additional capping layers, dielectric layers, and/or metal layers could be formed over the integrated circuit system 100 and the process of steps of FIGS. 11-16 could be repeated as desired to form a multi-level VNCAP structure.

Figure 17:
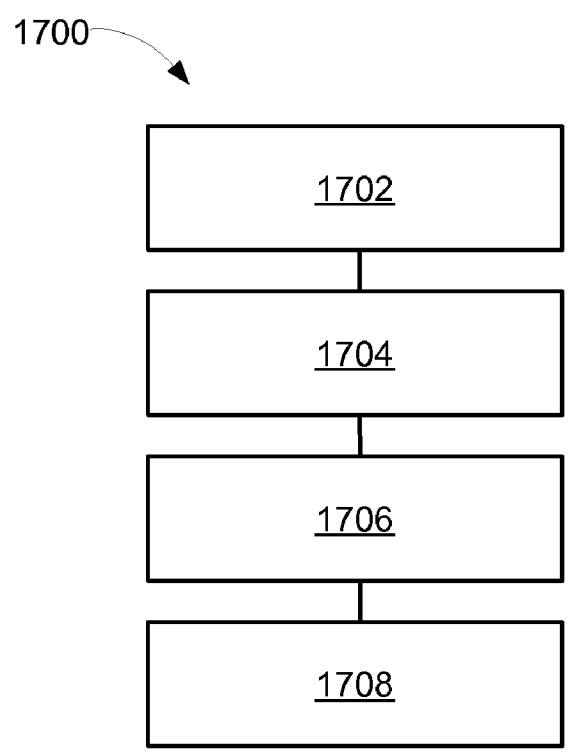
FIG. 17 is a flow chart of an integrated circuit system for an integrated circuit system in accordance with an embodiment of the present invention.

Referring now to FIG. 17, therein is shown a flow chart of an integrated circuit system 1700 for the integrated circuit system 100 in accordance with an embodiment of the present invention. The integrated circuit system 1700 includes providing a substrate including front-end-of-line circuitry in a block 1702; forming a first metallization layer over the substrate and electrically connected to the substrate in a block 1704; forming a viabar or a via group over the first metallization layer in a block 1706; and forming a second metallization layer over the first metallization layer and electrically connected to the first metallization layer through either the viabar or the via group in a block 1708.

It has been discovered that the present invention thus has numerous aspects. One such aspect is that the present invention improves the reliability performance of a VNCAP structure by forming a viabar or a via group with a horizontal via length or a combined horizontal via length that is at least twice as long as a horizontal via width.

Another aspect is that the present invention improves VNCAP radio frequency performance by lowering the interconnect resistance between vertically adjacent BEOL metallization layers. The present invention achieves this by forming the interconnect as a viabar or a via group, wherein the viabar and the via group possess a horizontal via length or a combined horizontal via length that is at least twice as long as a horizontal via width.

Another aspect is that the present invention increases VNCAP unit capacitance by effectively increasing the capacitor plate area of the VNCAP structure by employing the viabar and/or via group interconnects.

Another aspect is that the present invention can alter the viabar width and/or via group width within a VNCAP by using selective data preparation programs for mask tapout. Because the viabar and the via group methods and systems increase the total area of a local via, the incidence of an open via is greatly reduced, thereby providing process latitude with regards to the width dimension of the viabar and/or via group.

Another aspect is that the present invention does not require extra process steps that affect the baseline process or other devices.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing the reliability performance of a VNCAP. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
   providing a substrate including front-end-of-line circuitry;
   forming a first metallization layer over the substrate and electrically connected to the substrate;
   forming a via group over the first metallization layer; and
   forming a second metallization layer over the first metallization layer and electrically connected to the first metallization layer through the via group.

2. The system as claimed in claim 1 wherein:
   forming the via group includes forming each of the via within the via group to act independently.

3. The system as claimed in claim 1 wherein:
   forming the via group includes forming each of the via within the via group to act collectively.

4. The system as claimed in claim 1 wherein:
   forming the via group includes a staggered configuration.

5. The system as claimed in claim 1 wherein:
   forming the via group includes an adjacent configuration.

6. A method for manufacturing an integrated circuit system comprising:
   providing a substrate including front-end-of-line circuitry;
   forming a first metallization layer including a first conductive trace electrically connected to a first terminal and a second conductive trace electrically connected to a second terminal over the substrate and electrically connected to the substrate;
   forming a via group over each of the first conductive trace and the second conductive trace; and
   forming a second metallization layer including a first conductive trace electrically connected to a first terminal and a second conductive trace electrically connected to a second terminal over the first metallization layer and electrically connected to the first metallization layer through the via group.

7. The system as claimed in claim 6 wherein:
   forming the first metallization layer and the second metallization layer includes forming an inter-digitated structure.

8. The system as claimed in claim 6 wherein:
forming the first conductive trace and the second conductive trace includes forming the first conductive trace and the second conductive trace of opposite polarity.

9. The system as claimed in claim 6 wherein:
forming the first conductive trace and the second conductive trace includes forming the first conductive trace and the second conductive trace with a pitch of 800 nanometers or less.

10. The system as claimed in claim 6 further comprising:
forming a vertical natural capacitor.

11. An integrated circuit system comprising:
a substrate including front-end-of-line circuitry;
a first metallization layer over the substrate and electrically connected to the substrate;
a via group over the first metallization layer; and
a second metallization layer over the first metallization layer and electrically connected to the first metallization layer through the via group.

12. The system as claimed in claim 11 wherein:
the via group includes each of the via within the via group acting independently.

13. The system as claimed in claim 11 wherein:
the via group includes each of the via within the via group acting collectively.

14. The system as claimed in claim 11 wherein:
the via group is configured to alter capacitance or the occurrence of short circuits.

15. The system as claimed in claim 11 wherein:
the via group includes a staggered configuration.

16. The system as claimed in claim 11 wherein:
the via group includes an adjacent configuration.

17. The system as claimed in claim 11 wherein:
the first metallization layer and the second metallization layer include an inter-digitated structure.

18. The system as claimed in claim 11 wherein:
the first metallization layer and the second metallization layer each include a first conductive trace and a second conductive trace each of opposite polarity.

19. The system as claimed in claim 11 wherein:
the first metallization layer and the second metallization layer each include a first conductive trace and a second conductive trace with a pitch of 800 nanometers or less.

20. The system as claimed in claim 11 wherein:
the integrated circuit system includes a vertical natural capacitor.

* * * * *